United States Patent
Moriceau et al.

(10) Patent No.: US 10,586,783 B2
(45) Date of Patent: Mar. 10, 2020

(54) METHOD FOR DIRECT BONDING OF III-V SEMICONDUCTOR SUBSTRATES WITH A RADICAL OXIDE LAYER

(71) Applicants: Commissariat A L'Energie Atomique et aux Energies Alternatives, Paris (FR); SOITEC, Bernin (FR)

(72) Inventors: Hubert Moriceau, Saint-Egreve (FR); Bruno Imbert, Grenoble (FR); Xavier Blot, Grenoble (FR)

(73) Assignees: Commissariat A L'Energie Atomique et aux Energies Alternatives, Paris (FR); SOITEC, Bernin (FR)

(*) Notice: Subject to any disclaimer, the term of this patent is extended or adjusted under 35 U.S.C. 154(b) by 0 days.

(21) Appl. No.: 15/340,377

(22) Filed: Nov. 1, 2016

(65) Prior Publication Data
US 2017/0133347 A1    May 11, 2017

(30) Foreign Application Priority Data

Nov. 9, 2015  (FR) ..................... 15 60722

(51) Int. Cl.
*H01L 23/00*     (2006.01)
*H01L 21/762*    (2006.01)
(Continued)

(52) U.S. Cl.
CPC ............ *H01L 24/83* (2013.01); *H01L 21/187* (2013.01); *H01L 21/2007* (2013.01);
(Continued)

(58) Field of Classification Search
CPC . H01L 21/187; H01L 21/185; H01L 21/2007; H01L 21/8252; H01L 21/02241; H01L 21/02233; H01L 21/0223; H01L 24/83; H01L 2224/83894; H01L 2224/83935; H01L 2924/1032
See application file for complete search history.

(56) References Cited

U.S. PATENT DOCUMENTS 5,383,993 A  *  1/1995  Katada ................ H01L 21/2007
                                                148/DIG. 12
6,455,398 B1    9/2002  Fonstad, Jr. et al.
(Continued)

OTHER PUBLICATIONS

Masteika et al., "A Review of Hydrophilic Silicon Wafer Bonding", ECS Journal of Solid State Science and Technology, 3 (4) Q42-Q54, Feb. 3, 2014.*

(Continued)

*Primary Examiner* — Andrew Q Tran
(74) *Attorney, Agent, or Firm* — Oblon, McClelland, Maier & Neustadt, L.L.P.

(57) ABSTRACT

A manufacturing method including supplying a first substrate including a first face designated front face, the front face being made of a III-V type semiconductor, supplying a second substrate, forming a radical oxide layer on the front face of the first substrate by executing a radical oxidation, assembling, by a step of direct bonding, the first substrate and the second substrate so as to form an assembly including the radical oxide layer intercalated between the first and second substrates, executing a heat treatment intended to reinforce the assembly interface, and making disappear, at least partially, the radical oxide layer.

19 Claims, 2 Drawing Sheets

(51) Int. Cl.
*H01L 21/18* (2006.01)
*H01L 21/20* (2006.01)
H01L 33/00 (2010.01)

(52) U.S. Cl.
CPC .... *H01L 21/76251* (2013.01); *H01L 33/0079* (2013.01); *H01L 2224/83894* (2013.01); *H01L 2224/83935* (2013.01); *H01L 2924/1032* (2013.01)

(56) References Cited

U.S. PATENT DOCUMENTS

| | | |
|---|---|---|
| 2002/0048900 A1 | 4/2002 | Lo et al. |
| 2005/0085049 A1 | 4/2005 | Atwater, Jr. et al. |
| 2010/0178750 A1* | 7/2010 | Murakami ........ H01L 21/76256 438/459 |

OTHER PUBLICATIONS

Essig et al., "Fast Atom Beam-Activated n-Si/n-GaAs Wafer Bonding with High Interfacial Transparency and Electrical Conductivity", Journal of Applied Physics 113, 203512, May 28, 2013).*
French Preliminary Search Report dated Jun. 17, 2016 in French Application 15 60722, filed on Nov. 9, 2015 ( with English Translation of Categories of Cited Documents).
J. W. Matthews et al. "Defects in Epitaxial Multilayers", Journal of Crystal Growth 27, 1974, 8 pages.
Keisuke Nakayama et al. "Improved electrical properties of wafer-bonded p-GaAs/n-InP Interfaces with sulfide passivation", Journal of Applied Physics 103, 2008, 6 pages.

* cited by examiner

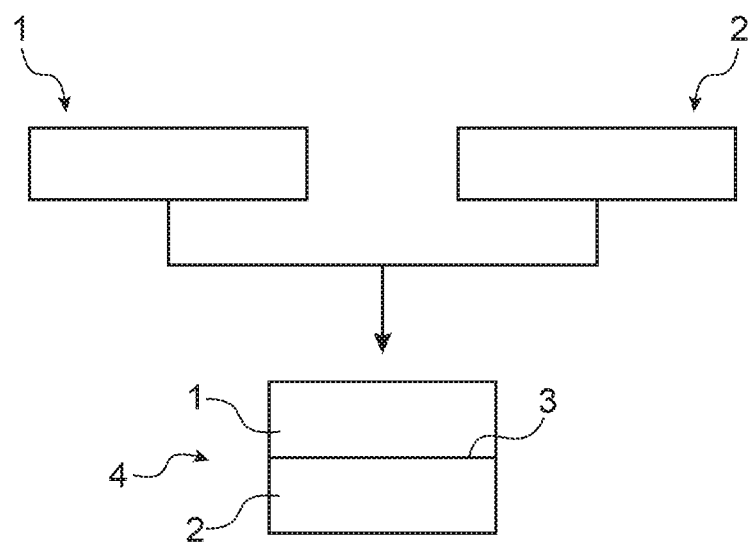
PRIOR ART
FIG.1
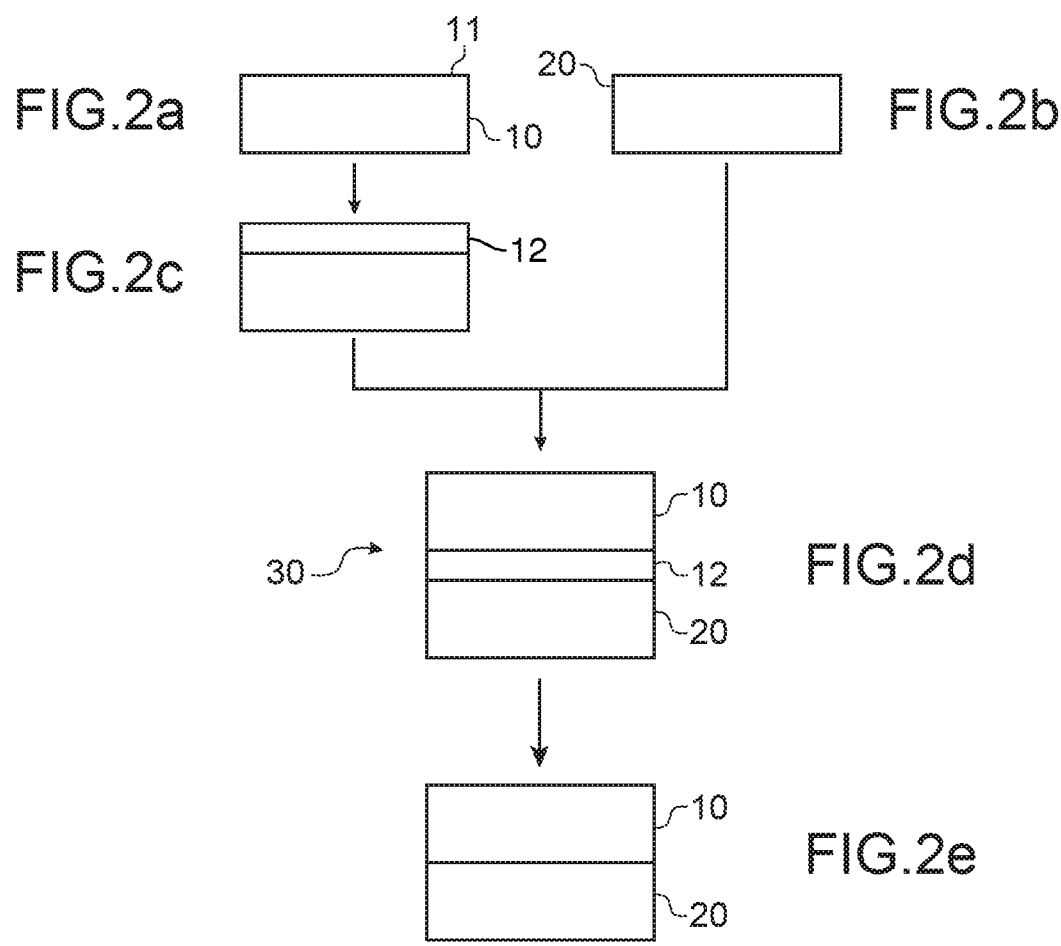

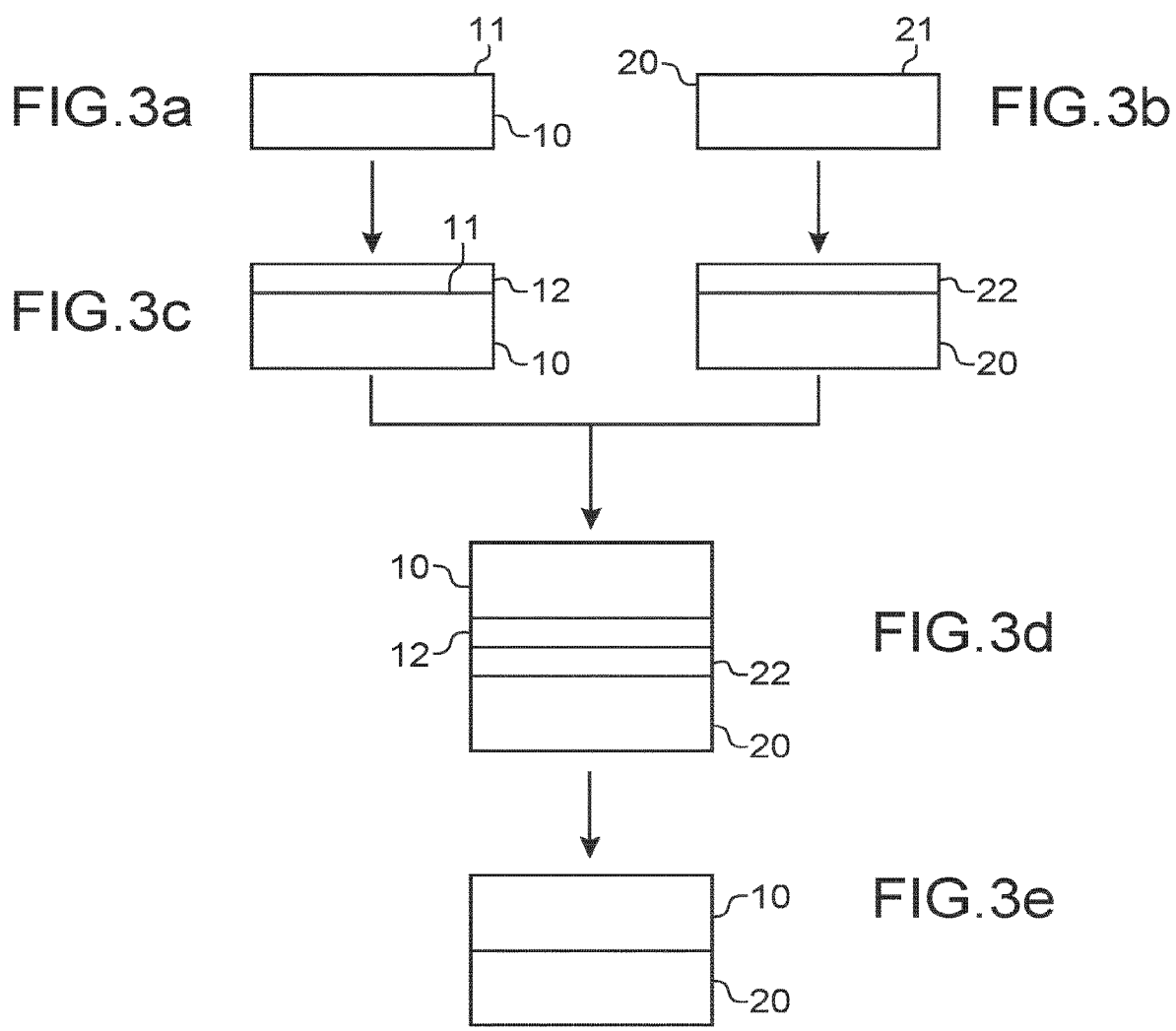

METHOD FOR DIRECT BONDING OF III-V SEMICONDUCTOR SUBSTRATES WITH A RADICAL OXIDE LAYER

TECHNICAL FIELD AND PRIOR ART

The method thus creates, before step d), a radical oxide layer by radical oxidation process. The radical oxide layer is properly controlled, reproducible and stable.

FIG. 1 shows a manufacturing method known from the prior art and described by K. Nakayama et al. [1] which comprises the following steps:

a) supplying a first III-V type semiconductor substrate 1,
b) supplying a second III-V type semiconductor substrate 2,
c) assembling the first substrate 1 and the second substrate 2 so as to form an assembly comprising the first substrate 1 and the second substrate 2.

However, this method is not satisfactory.

In fact, before being placed in contact at step c) of assembly, the surfaces of the first and second substrates are in general cleaned in such a way as to be totally or partially de-oxidized, and to have a hydrophilic character. Step c) corresponds, in general, to a step of direct bonding of hydrophilic surfaces. There is thus a presence of water at the assembly interface of the first and second substrates. This water generates a native oxide, at the interface of the bonded substrates, when the contacted surfaces have been efficiently de-oxidized. The generation of this native oxide is not properly controlled and this generates in general problems of reproducibility of the bonding and the physical and chemical properties at the bonding interface.

Moreover, the native oxides generated before, during or after the cleanings and before the placing in contact are also disadvantageous because they can react in a not properly controlled manner with water present at the bonding interface.

Thus, native oxides may be present on the surfaces of the first 1 and second 2 III-V type semiconductor substrates intended to be assembled. They are difficult to reproduce because they strongly depend on numerous environmental parameters (humidity, temperature, nature of the atmosphere, presence of contaminant, etc.). The presence of said native oxides thus degrades the electrical and/or thermal conductivity properties of the interface of the assembly formed at step c) of the method known from the prior art.

Furthermore, among the native oxides present on the surface of a III-V type semiconductor substrate, some can sublime at temperatures below 200° C. This is particularly harmful when a heat treatment, which is generally carried out at temperatures above 200° C., must be executed to reinforce the interface of the assembly thereby formed.

Moreover, the diversity of native oxides that can be observed on the surface of a III-V type semiconductor substrate is harmful to the proper control of the manufacturing method, and can introduce a variability of the properties of the assembly interface. It appears necessary to control properly both water at the bonding interface and the presence of native oxides It could be advantageous to carry out a removal of native oxides before executing step c) of assembly.

The removal of native oxides may be carried out using a chemical solution comprising for example hydrogen fluoride (HF), or ammonium sulfide ($(NH_4)_2S$), a solution chosen depending on the type of materials to de-oxidize and according to the knowledge of those skilled in the art.

Also, in order to avoid, or to slow down, the reformation of native oxides on the surfaces, a step of passivation of said surfaces is then executed following the oxide removal step. The passivation step makes it possible to saturate the de-oxidized surfaces with atoms, for example atoms of hydrogen, nitrogen or sulfur.

Moreover the de-oxidization step may also be the passivation step.

Yet, the passivation does not resist for very long from the moment that the surfaces intended to be assembled are again exposed to the ambient atmosphere before executing step c) of assembly. A reformation of native oxides on the surfaces to be assembled then ensues.

Consequently, the delay between the passivation step and step c) of direct bonding has to be quite short, for example less than or of the order of one hour, or even of the order of several minutes, in order to be able to benefit from the effects of the passivation.

Furthermore, the passivation step may imply the use of a chemical solution based on $(NH_4)_2S$, which is a product that is costly and difficult to handle.

Moreover, a passivation step may introduce contamination at the assembly interface.

To overcome these problems, Shiro Uchida et al. [2], proposes that an activation step by ion beam bombardment of the surfaces of the first 1 and second 2 substrates intended to be placed in contact is executed before step c) of assembly.

The exposure of the surfaces to ion beam bombardment, for example by argon, has the effect of removing the native oxides, and activating said surfaces, namely to form dangling bonds.

However, this method is also not satisfactory.

In fact, in order not to re-oxidize the activated surfaces, Shiro Uchida et al. [2] propose practicing step c) of assembly in a high vacuum chamber incorporating the argon ion canon necessary for the ion beam bombardment of the aforementioned surfaces.

Such a device is both costly and complicated to implement. Furthermore, the low production throughput of such equipment is disadvantageous to the time cycle, and makes said equipment incompatible with the requirements of an industrial environment.

However, obtaining heterostructures comprising a stack of a first and a second substrate having a surface composed of III-V type semiconductor materials or supporting layers of III-V type semiconductor materials (for example, a stack of indium phosphide alloys and gallium arsenide alloys) having low electrical and thermal resistance at the bonding interface is of great interest in the fields of energy, opto-electronics and microelectronics.

Notably, during the manufacture of photovoltaic cells, substrates of indium phosphide 1 on gallium arsenide 2 are well suited to forming by epitaxial growth junctions intended to transform light energy into electrical energy.

Such substrates must have good mechanical strength and/or thermal resistance so as not to undergo degradations during the steps of manufacturing the photovoltaic cells.

Furthermore, in order to be able to collect the electrical current generated by the photovoltaic cells, it is necessary to obtain a specific electrical resistance (measured in ohm·$cm^2$) at the bonding interface 3 that is as low as possible.

An aim of the invention is thus to define a method for manufacturing a stack comprising a first substrate having a surface composed of III-V type semiconductor materials and a second substrate, and which has a better controlled assembly interface. Another aim of the invention is also to define a manufacturing method making it possible to reduce the time and/or technological constraints imposed by methods known from the prior art.

DESCRIPTION OF THE INVENTION

The aforementioned aims are attained by a manufacturing method comprising the following steps:

a) supplying a first substrate comprising a first face designated front face, said front face being made of a III-V type semiconductor, b) supplying a second substrate, c) forming a radical oxide layer on said front face of the first substrate by executing a step of radical oxidation, d) assembling, by a step of direct bonding, the first substrate and the second substrate so as to form an assembly comprising the radical oxide layer intercalated between the first and second substrates, e) executing a heat treatment intended to reinforce the interface of the assembly formed at step d), and making disappear, at least partially, the radical oxide layer.

The invention provides to create voluntarily, before step d), a radical oxide layer by radical oxidation process. The radical oxide layer is properly controlled, reproducible and stable.

The radical oxide layer created by radical process can disappear at least partially at relatively low temperature such that the interface of the assembly is electrically and/or thermally conducting.

Thus the radical oxide layer formed by radical oxidation on the front face of the semiconductor substrate makes it possible to passivate the surface in a stable manner, namely to make said surface chemically inert to the open air for several hours. In fact, the radical oxide layer then slows down very considerably, or even prevents, the reformation of a native oxide layer on the front face of the III-V type semiconductor substrate. Thanks to the stability over time of the radical oxide layer, a waiting time of several hours (for example between 1 and 4 hours) may be allowed between step c) and step d). Thus, unlike what is observed in the prior art, the time constraints are relaxed.

Furthermore, the presence of the radical oxide layer limits any reaction of the III-V type semiconductor substrate with water present at the interface assembly. The assembly interface is then better controlled.

Moreover, the Applicant has noted that the radical oxide layer formed by radical oxidation, and present at the assembly interface at the end of step d), disappears, at least partially, under the effect of a heat treatment.

In addition, any degradation of the front face, such as an amorphization on an upper part of the first substrate, for example over several nanometers thickness, may be lessened or even eliminated by step c) of radical oxidation which consumes the amorphized (degraded) part of the first substrate.

According to a mode of implementation, step c) of radical oxidation is executed at atmospheric pressure.

Atmospheric pressure is taken to mean a pressure between 0.5 bars and 5 bars, preferentially between 0.5 bars and 1.5 bars, even more preferentially between 0.9 bars and 1.1 bars.

According to a mode of implementation, the front face is de-oxidized before executing step c).

According to a mode of implementation, step d), of direct bonding, is executed under a controlled humidity atmosphere according to one of the following conditions:

under an atmosphere having a water partial pressure less than $10^{-1}$ Pa, or under a partial vacuum, the partial vacuum having a pressure less than 10 Pa, preferentially less than 1 Pa, even more preferentially less than $10^{-1}$ Pa.

Thus the quantity of water present at the assembly interface at the end of step d) of direct bonding is reduced, thereby limiting in the most efficient manner secondary reactions capable of taking place at the bonding interface.

According to a mode of implementation, the thickness of the radical oxide layer, formed at step c), is less than 5 nm, preferentially less than 3 nm, even more preferentially less than 2 nm.

According to a mode of implementation, the radical oxidation is executed under an atmosphere of ozone and/or oxygen illuminated by ultraviolet radiation.

According to a mode of implementation, the second substrate comprises at least one of the elements selected from among: silicon, germanium, alloy of silicon/germanium, sapphire, glass, quartz, SiC, alumina.

According to a mode of implementation, the second substrate is a substrate comprising a second face, designated second front face, said face being made of a III-V type semiconductor, the method also comprises a step c1) of formation of a second radical oxide layer by radical oxidation, on the second front face, the second radical oxide layer being in contact with the radical oxide layer after step d) of direct bonding.

According to a mode of implementation, the second front face is de-oxidized before executing step c1).

According to a mode of implementation, the thickness of the second radical oxide layer is less than 5 nm, preferentially less than 3 nm, even more preferentially less than 2 nm.

According to a mode of implementation, the second substrate comprises at least one of the elements based on: InP, GaAs, $In_{1-x}As_xP$, $InP_{1-x}Ga_x$, $In_{1-x}As_xP_{1-y}Ga_y$, alloys of column III and V materials.

According to a mode of implementation, the first substrate comprises at least one of the elements based on: InP, GaAs, $In_{1-x}As_xP$, $InP_{1-y}Ga_y$, $In_{1-x}As_xP_{1-y}Ga_y$, alloys of column III and V materials.

BRIEF DESCRIPTION OF THE DRAWINGS

Other characteristics and advantages will become clear from the description that follows of modes of implementing the manufacturing method according to the invention, given as non-limiting examples, with reference to the appended drawings in which:

FIG. 1 is a schematic representation of a manufacturing method known from the prior art, FIGS. 2a-2e are schematic representations of a first embodiment of the method according to the invention, FIGS. 3a-3e are schematic representations of a second embodiment of the method according to the invention.

DETAILED DESCRIPTION OF PARTICULAR EMBODIMENTS

For the different modes of implementation, the same references will be used for identical elements or elements assuring the same function, for the sake of simplification of the description.

Bulk substrate: bulk substrate is taken to mean a substrate having a chemical composition essentially identical at all points of its volume.

Upper part of a substrate: upper part of a substrate is taken to mean an area of the substrate extending from a free surface, notably its front face, towards the inside thereof, over a thickness less than several nm, for example less than 5 nm.

III-V type semiconductor: III-V type semiconductor is taken to mean an alloy comprising an element of column III and an element of column V of the periodic table of elements, the III-V type semiconductor being potentially doped.

Surface passivation: surface passivation is taken to mean making the surface of a substrate chemically inert to its exterior environment.

According to a first embodiment, the manufacturing method, illustrated in FIGS. 2a-2e, comprises a step a) consisting in supplying a first substrate 10.

The first substrate 10 comprises a first face, designated front face 11. Said front face 11 is made of a III-V type and crystalline semiconductor material, advantageously monocrystalline.

For example the first substrate 10 may be a bulk substrate.

In an advantageous manner, the roughness of the front face 11 is compatible with a step of direct bonding. For example, the roughness of the front face 11 is less than 1 nm RMS, preferably less than 0.5 nm, measured by atomic force microscopy, and according to a measurement field of 5 μm×5 μm.

The first substrate 10 may comprise at least one of the materials selected from among: InP, GaAs, $In_{1-x}As_xP$, $InP_{1-y}Ga_y$, $In_{1-x}As_xP_{1-y}Ga_y$, alloys of column III and V materials.

The first substrate 10 may be composite or even include levels of processes. In particular, the first substrate 10 may comprise a support substrate and layers of interest, active or passive.

The manufacturing method comprises a step b), which consists in supplying a second crystalline substrate 20, advantageously monocrystalline.

The second substrate 20 may comprise at least one of the materials: silicon, germanium, alloy of silicon/germanium, sapphire, alumina, glass, quartz, SiC.

The method according to the invention comprises a step c) which consists in forming a radical oxide layer 12 on said front face 11 by a step of radical oxidation.

The radical oxide layer 12 is obtained by oxidizing an upper part of the first substrate 10.

The upper part of the substrate 10 extends from the front face 11 of the first substrate 10 to the inside thereof.

The radical oxidation does not affect the roughness of the front face 11 of the first substrate 10, and thus makes it possible to conserve a roughness compatible with a step of direct bonding.

Furthermore, step c) of radical oxidation consumes native oxides capable of being present on the front face 11 of the first substrate 10.

The radical oxidation step, enabling the formation of the radical oxide layer 12, is carried out by generation of an oxidizing radical species, for example the atomic oxygen radical (here noted O*, strong oxidizing agent). The atomic oxygen radical (radical, or free radical) may be obtained by ultraviolet illumination, for example of oxygen, and/or ozone, and/or water.

Step c) of radical oxidation may be executed at atmospheric pressure, while avoiding oxidation heat treatments at high temperature. Atmospheric pressure is taken to mean a pressure between 0.5 bars and 5 bars preferentially between 0.5 bars and 1.5 bars, even more preferentially between 0.9 bars and 1.1 bars.

The radical oxygen O*, being an unstable species (thus very reactive), reacts with the front face 11 to oxidize said surface.

The radical oxidation step is preferentially enhanced by ultraviolet radiation which participates in the formation of the radical oxygen.

According to a particularly advantageous embodiment, the radical oxidation step is carried out from oxygen, and/or ozone, and/or water, and ultraviolet radiation having primary wavelengths preferentially of the order of 185 nm and 254 nm (for example radiation from a low pressure mercury vapor lamp).

In a particularly advantageous manner, the radical oxidation step is carried out with surrounding oxygen. Under the action of ultraviolet radiation, oxygen dissociates into ozone and into radical oxygen O*. The radical oxygen O* then reacts with the front face 11 of the first substrate 10 to form the radical oxide layer 12.

Thus, atomic oxygen is then generated from oxygen illuminated by UV radiation comprising two wavelengths $\lambda_1$ and $\lambda_2$, according to the two theoretical reactions:

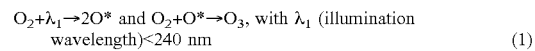  (1)

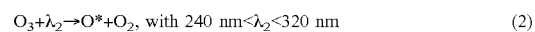  (2)

The UV illumination, comprising the two wavelengths $\lambda_1$ and $\lambda_2$, may be executed using equipment comprising a low pressure mercury vapor UV lamp. In fact, the UV emission spectrum, from such a low pressure mercury vapor UV lamp, comprises two notable intensity rays at the wavelengths $\lambda_1=184.9$ nm and $\lambda_2=253.7$ nm. Thus, the illumination of oxygen with two wavelengths $\lambda_1=184.9$ nm and $\lambda_2=253.7$ nm makes it possible to destroy continually the ozone formed during the reaction (1), and thus to have permanently radical oxygen.

Moreover, the radical oxidation step does not damage the surface during oxidation. For example, a InP substrate of roughness (measured by AFM in a spatial frequency range >1 $\mu m^{-1}$) less than 0.5 nm in RMS value before treatment (for example 0.3 nm) will not be affected after treatment of radical oxidation and will have a roughness less than 0.5 nm RMS (0.3 nm for example) after executing the radical oxidation step.

Consequently, the surface will always be compatible with a step of direct bonding d) discussed hereafter.

Atomic oxygen may also be generated from ozone also illuminated by UV radiation.

In this case, reactions (1) and (2) remain valid. Ozone may be generated, for its part, in various ways and for example:

It is for example possible to generate ozone from oxygen. More particularly, the illumination of oxygen with UV radiation comprising the wavelength $\lambda_1=184.9$ nm, ozone may be generated in an equipment including a lamp emitting UV radiation comprising the wavelength $\lambda_1=184.9$ nm, and in which is allowed to enter at least one of the species selected from among: oxygen, dry air, damp air, etc. Thus, in the case of oxygen for example, the latter under the effect of UV radiation comprising the wavelength $\lambda_1=184.9$ am is transformed into ozone according to the reaction (1) ($O_2+\lambda_1 \rightarrow 2O^*$ and $O_2+O^* \rightarrow O_3$). Typically, ozone concentrations in oxygen or in standard atmospheric air greater than 1 g/m³ may be reached, and for example of the order of several g/m³ of air (e.g. 3 g/m³). In this way, at atmospheric pressure, mass ratios of ozone over air typically between 0.1% and 1% (for example 0.25%) are reached. The equipment Jelight-UVOCs sold by the firm Jelight Company may for example be used.

Ozone may also be obtained using an ozone generator, for example a commercially available ozone generator (for example of Ozone Generator BMT 803 type sold by the firm BMT Messtechnik GMBH). The quantity of ozone produced (in g/m$^3$) depends considerably on the flow rate measured in slm (standard liters per minute) of the initial gas (for example oxygen). Typically, it is possible to attain concentrations of several tens of g/m$^3$ (for example 30 g/m$^3$) to 250 g/m$^3$, as a function of the flow rate of gas at the inlet. Mass ratios of ozone over the mass of air comprised, typically, between 1% and 25% are thus reached, at atmospheric pressure. It is possible to use equipment of SAMCO-UV2 type.

Moreover and in a particularly advantageous manner, radiation with a UV radiation comprising the wavelength $\lambda_2 = 253.7$ nm is also absorbed by numerous hydrocarbons. The excitation of these hydrocarbons and the presence of radical oxygen induces the formation of volatile species that desorb from the surface. Thus, from the moment that hydrocarbons are present on the front face 11 of the first substrate 10, step c) of radical oxidation makes it possible to transform said hydrocarbons into volatile species, and thus participate in the cleaning of said front face 11. This effect is particularly interesting for the step of direct bonding d) discussed hereafter.

Incidentally, it is also possible to generate radical oxygen from other gases. Nitrogen dioxide $NO_2$, which releases nitric oxide NO and an O* radical, may for example be cited.

It should be noted that it is also possible to obtain radicals from other oxygen-containing species, for example, free radicals centered on oxygen, and among which may be cited $HO_2^*$ (perhydroxyl radical), HO* (hydroxyl radical), $RO_2^*$ (peroxyl radical), RO* (alkoxyl radical), etc.

Advantageously, the radical oxidation step is carried out at a temperature less than 400° C., advantageously at room temperature.

Thus, a radical oxidation carried out at room temperature is slower such that the rate of radical oxidation is better controlled.

In certain applications, notably when a higher thickness of the radical oxide layer 12 is desired, it is possible to accelerate the process of radical oxidation by using temperatures greater than room temperature. A radical oxide layer 12 of high thickness may be desirable when native oxides are present on the front face 11 of the first substrate 10.

Moreover, if for a reason (for example to oxidize an amorphous area over several nanometers), the radical oxide layer is generated with a thickness greater than the targeted thickness for the bonding step d), then an additional step of thinning of the radical oxide layer may be implemented. This step may be carried out in a very precise manner by wet chemical attack (for example by means of a solution containing ammonium sulfide (($NH_4)_2S$) or hydrogen fluoride (HF)) or by means of dry etching (for example with use of a reducing gas).

Unlike thermal oxidation, radical oxidation does not require the use of heavy equipment, complex to implement.

The radical oxide layer 12, formed by radical oxidation, then serves as passivation of the front face 11 of the first substrate 10.

As an example, for applications in photovoltaics and in the case of a GaAs substrate N type doped with a concentration of 2 to $4 \times 10^{18}$ atoms/cm$^{-3}$ of atoms of silicon, radical oxidation of a substrate is executed according to the following conditions:

the GaAs substrate is arranged on a support maintained at room temperature and exposed to the surrounding air, the surface of the GaAs substrate to oxidize is illuminated by an ultraviolet light of wavelength of 185 nm and 254 nm (reference equipment T10X10/OES from UVOCS™), the exposure time of the surface of the GaAs substrate to the ultraviolet illumination is 3 minutes.

The aforementioned operating conditions make it possible to generate a radical oxide layer on the surface of the GaAs substrate of 1.9 nm.

For equivalent operating conditions, a radical oxide layer of 1.8 nm is formed on the surface of an InP substrate (the substrate being potentially doped with atoms of sulfur at a concentration of 3 to $6 \times 10^{18}$ atoms per cm$^3$).

Advantageously, the thickness of the radical oxide layer 12, formed at step c) of radical oxidation, is less than 5 nm, preferentially less than 3 nm, even more preferentially less than 2 nm.

A step of de-oxidization of the front face 11 may be executed before step c) of radical oxidation of said face 11.

It is then possible to have available a time of several minutes to several tens of minutes between the implementation of de-oxidization and the implementation of radical oxidation. After the implementation of de-oxidization and before step c) of radical oxidation, the presence of a native oxide of low thickness (for example of the order of the thickness of the radical oxide to form, or better a thickness of less than one fifth and more advantageously less than one tenth of the thickness of the layer of the radical oxide 12) will not be troublesome, in so far as this native oxide will then be transformed during the time of radical oxidation.

The de-oxidization step may be executed for example by plasma (in particular with a reducing gas), by bombardment by a beam of argon ions, and/or by action of a chemical de-oxidization solution. For example, the chemical de-oxidization solution may comprise at least one of the elements among: HF, HCl, $H_2SO_4$, $NH_4OH$, $(NH_4)_2S$ depending on the type of III-V material and according to the knowledge of those skilled in the art.

Unlike the prior art, the upper part of the first substrate 10 damaged (amorphized) by de-oxidization by ion bombardment does not pose a problem; in fact the latter will be transformed at least partially during the formation of the radical oxide layer 12.

Step c) is followed by step d) of direct bonding of the radical oxide layer 12 and the second substrate 20.

The radical oxide layer 12 being stable over time, a waiting time of several hours (for example between 1 and 4 hours) may be observed between step c) and step d), without the efficiency of the passivation of the front face 11 by the radical oxide layer 12 being degraded. This is confirmed in particular by a stability of the thickness of the radical oxide layer 12 measured by ellipsometry for example.

Step d) comprises a step of direct bonding of the radical oxide layer 12 with a face of the second substrate 20. During the step of direct bonding, the radical oxide layer 12 and said face of the second substrate 20 are placed in contact, more particularly in intimate contact, such that they can adhere to each other.

At the end of step d) of direct bonding, an assembly 30 is formed. Said assembly 30 then includes a radical oxide layer 12 arranged between the first 10 and the second 20 substrate.

Since passivation by a radical oxide layer 12 has better stability over time than passivations known from the prior art, it is possible to observe a delay of several hours (for example 4 hours) between the formation of the radical oxide layer 12 and the bonding step. Throughout this delay, the effects of passivation of the radical oxide layer 12 are conserved. The time constraint observed in the prior art is thus relaxed.

Step d) of direct bonding may be executed at atmospheric pressure. During the placing of the radical oxide layer 12 to be in contact with the second substrate 20, a bonding wave may be initiated by means of a mechanical pressure exerted at a point where the two substrates 10 and 20 are to be assembled.

According to an advantageous embodiment, step d) of direct bonding is executed under a controlled humidity atmosphere, namely an atmosphere having a low humidity level.

According to a first alternative, step d) of direct bonding under a controlled humidity atmosphere may also be executed under an atmosphere having a water partial pressure less than $10^{-1}$ Pa.

To do so, step d) of direct bonding under a controlled humidity atmosphere is executed in a contained enclosure, in which the humidity level is controlled.

For example the humidity level may be controlled by the implementation of a molecular sieve making it possible to assure a dew point temperature of around −90° C. and a water content less than 1 ppm in an enclosure at atmospheric pressure (which corresponds to a water partial pressure less than $10^{-1}$ Pa for a total pressure equal to atmospheric pressure).

According to a second alternative, step d) of direct bonding under a controlled humidity atmosphere may be executed under a partial vacuum, the partial vacuum having a pressure less than 10 Pa, preferentially less than 1 Pa, even more preferentially less than $10^{-1}$ Pa.

When the radical oxide layer 12 and the second substrate 20 are placed in contact, and when the partial vacuum reaches a pressure less than 10 Pa, preferentially less than 1 Pa, and even more preferentially less than $10^{-1}$ Pa, a bonding wave is initiated and propagates in a spontaneous manner such that the radical oxide layer 12 and the second substrate 20 are linked by direct adhesion (also designated molecular adhesion).

The aforementioned first and second alternatives have the interest of reducing the quantity of water present at the bonding interface during step d). This is then known as a step of direct bonding executed under a controlled humidity atmosphere. Thus few or no reaction products will be observed at the assembly interface, then preventing the degradation of the electrical, thermal and optical properties of the assemblies 30 thereby formed.

Step d) is then followed by step e) of heat treatment intended to reinforce the bonding interface and making disappear, at least partially, the radical oxide layer 12.

Step e) of heat treatment may be executed at a temperature less than 600° C., preferably between 200° C. and 550° C., and better between 200° C. and 500° C. under a non-oxidizing atmosphere, for example argon.

Step e) of heat treatment lasts, depending on the chosen temperature, between several minutes and several hours, for example between 10 minutes and 3 hours, for a thickness of radical oxide layer 12 between 0.2 nm and 5 nm.

The conditions for executing step e) of heat treatment, namely the duration and the temperature to apply, depend on the thickness of radical oxide 12 to resorb and the acceptable thickness of radical oxide at the bonding interface at the end of the heat treatment (for example defined by an electrical and thermal conduction criterion or by an optical absorption criterion, criteria imposed by the application). The conditions for executing step e) also depend on the expected reinforcement for the bonding.

Thus, the Applicant has noted that the radical oxide layer 12 formed by radical oxidation, and present at the assembly interface at the end of step d), disappears, at least partially, under the effect of a heat treatment executed at a temperature less than 600° C. Thus, the method according to the invention makes it possible to assemble substrates having different coefficients of thermal expansion without all the same degrading the assembly interface during step e) of heat treatment.

Furthermore, the presence of the radical oxide layer 12 limits the reaction of the III-V type semiconductor surface of the first (or second) substrate with water present at the assembly interface. The assembly interface is then better controlled.

Moreover, the Applicant has, also, been able to note that a wait of 4 hours between steps c), of radical oxidation, and d), of direct bonding, does not alter the quality of the bonding interface.

The problem of multiplicity of types of native oxides capable of being present on the front face of a III-V type semiconductor substrate is thus resolved. In fact, the presence of a radical oxide layer, formed by radical oxidation, limits the reformation of non-controlled native oxides.

In addition, any degradation of the front face, such as an amorphization, is improved, lessened or even eliminated by the radical oxidation step which consumes, at least in part, the upper degraded part of the substrate.

Finally, the quantity of water present at the assembly interface, during step d) carried out under a controlled humidity atmosphere, is reduced.

The invention also comprises a second embodiment, shown in FIGS. 3a-3e, in which the second substrate 20 comprises a second front face 21 made of a III-V type semiconductor.

The second embodiment differs from the first embodiment in that it comprises a step c1) which consists in forming a second radical oxide layer 22 by radical oxidation of the second front face 21.

Step c1) is executed before step d) of direct bonding.

A step of de-oxidization of the second front face 21 may be executed before step c1).

The de-oxidization step may be executed for example by plasma (in particular with a reducing gas), by bombardment by a beam of argon ions, and/or by action of a chemical de-oxidization solution. For example, the chemical de-oxidization solution may comprise at least one of the elements among: HF, HCl, $H_2SO_4$, $NH_4OH$, $(NH_4)_2S$ depending on the type of III-V materials and according to the knowledge of the prior art.

Unlike the prior art, the upper part of the second substrate 20 damaged (amorphized) by plasma de-oxidation does not pose a problem. In fact, this damaged part will be improved, lessened or even eliminated during the formation of the second radical oxide layer 22.

The radical oxidation is carried out according to the same modalities as step c) of radical oxidation described previously in the description of the first embodiment.

The second substrate 20 may be a bulk substrate.

The second radical oxide layer 22 is in contact with the radical oxide layer 12 after step d) of direct bonding.

The second substrate 20 may comprise at least one of the elements selected from among: InP, GaAs, $In_{1-x}As_xP$, $InP_{1-y}Ga_y$, $In_{1-x}As_xP_{1-y}Ga_y$, alloys of column III and V materials.

The thickness of the second radical oxide layer 22 is less than 5 nm, preferentially less than 3 nm, even more preferentially less than 2 nm.

Thus, as an illustration of the second embodiment, the method according to the invention comprises the following successive steps:

supplying a first InP substrate 10 (of N type, doped by sulfur at a concentration of 2.6 to 5.7 $10^{18}$ cm$^{-3}$) and a second GaAs substrate 20 (of N type, doped by silicon at a concentration of 2 to 3.7 $10^{18}$ cm$^{-3}$), removing the native oxide from the first 10 and second 20 substrates with a solution comprising sulfuric acid $H_2SO_4$, forming a radical oxide layer 12 on the first substrate 10 and a second radical oxide layer 22 on the second substrate 20 by a step of radical oxidation; the radical oxidation is executed at room temperature, with UV illumination of the surfaces to oxidize at the wavelengths of 185 nm and 254 nm, under ambient air, assembling the radical oxide layer 12 and the second radical oxide layer 22 under a controlled humidity atmosphere, namely comprising a water partial pressure less than $10^{-1}$ Pa, executing a heat treatment of the assembly thereby formed at a temperature of 500° C. and for a duration of 1 hour.

According to a first example of this illustration of the second embodiment:

For a radical oxidation time of 3 minutes, a radical oxide layer 12 of a thickness of 1.8 nm is formed on the first substrate 10, and a second radical oxide layer 22 of 1.9 nm is formed on the second substrate 20.

The specific interface electrical resistance of an assembly thereby constituted is 4.5 mΩ·cm$^2$ for a step of radical oxidation.

According to a second example of this illustration of the second embodiment:

For a radical oxidation time of 15 minutes, a radical oxide layer 12 of a thickness of 2.1 nm is formed on the first substrate 10, and a second radical oxide layer 22 of 3.8 nm is formed on the second substrate 20.

The interface electrical resistance of an assembly thereby constituted is 9.5 mΩ·cm$^2$ for a step of radical oxidation.

According to this second embodiment, it is the radical oxide layer 12 and the second radical oxide layer 22 that disappear, at least partially, during step e) of heat treatment.

The method thus described makes it possible to obtain bonding interfaces having a low interface electrical resistance suitable, for example, for the production of solar cells.

Furthermore, the Applicant has also been able to observe better stability over time of a radical oxide layer formed by radical oxidation.

Moreover, the Applicant has noted, during step e) of heat treatment, the disappearance, at least partial, of the oxide layers formed by radical oxidation. Thus, despite the presence of a radical oxide layer at the assembly interface, it is possible to make the assembly interface electrically conducting by a simple thermal annealing executed at a moderate temperature (less than 600° C.).

Also, damage, created by potential de-oxidization of the surfaces executed by ion bombardment may be corrected partially or even totally by the method according to the invention. Little damage is then present in the semiconductor materials around the assembly interface. In fact, in addition to passivating the surface or surfaces to bond, a radical oxide layer formed by radical oxidation also consumes the part of the substrate that could have been damaged, for example, during a step of de-oxidization by ion bombardment.

The method according to the invention also makes it possible to guard against effects caused by the presence of native oxides that would not have been transformed by the radical oxidation.

The method according to the invention can be advantageously used in the manufacture of solar cells based on III-V type semiconductors.

In fact, the manufacture of such devices involves the bonding of junctions made of III-V type semiconductors, and for which the bonding interfaces have to have as low an interface electrical resistivity as possible.

REFERENCES

[1] Keisuke Nakayama, Katsuaki Tanabe, and Harry A. Atwater, *"Improved electrical properties of wafer-bonded p-GaAs/n-InP interfaces with sulfide passivation"* Journal of Applied Physics, 2008, vol. 103, 094503 (2008).

[2] Shiro Uchida et al., *"Room-temperature GaAs/InP wafer bonding with extremely low resistance"*, Appl. Phys. Express, 2014, vol. 7, pages 112301-1-112301-4.

[3] Paul H. Holloway et al., Handbook of Compound Semiconductors, *"Growth, Processing, Characterization, and Devices"*, Cambridge University Press, 19 Oct. 2008, chapter 7.

The invention claimed is:

1. A manufacturing method, comprising:
   forming a first radical oxide layer on a first front face of a first substrate by executing a radical oxidation,
   assembling, by a direct bonding, the first substrate and a second substrate so as to form an assembly having an assembly interface comprising the first radical oxide layer intercalated between the first and second substrates, and
   executing a heat treatment for reinforcing the assembly interface so that the first radical oxide layer disappears, at least partially, and the assembly interface becomes electrically conducting,
   wherein
   the first front face is made of a III-V type semiconductor, and
   the radical oxidation is executed under an atmosphere of ozone and/or of oxygen illuminated by ultraviolet radiation.

2. The manufacturing method according to claim 1, wherein the radical oxidation is executed at atmospheric pressure.

3. The manufacturing method according to claim 1, further comprising:
   de-oxidizing the first front face before forming the first radical oxide layer.

4. The manufacturing method according to claim 1, wherein the direct bonding is executed under a controlled humidity atmosphere according to one of the following conditions:
   under an atmosphere having a water partial pressure of less than $10^{-1}$ Pa, and
   under a partial vacuum having a pressure of less than 10 Pa.

5. The manufacturing method according to claim 1, wherein the first radical oxide layer has a thickness of less than 5 nm.

6. The manufacturing method according to claim 1, wherein the ultraviolet radiation is executed with a first primary illumination wavelength $\lambda_1$ satisfying expression (1) and a second primary illumination wavelength $\lambda_2$ satisfying expression (2):

$$\lambda_1 < 240 \text{ nm} \quad (1),$$

$$240 \text{ nm} < \lambda_2 < 320 \text{ nm} \quad (2).$$

7. The manufacturing method according to claim 6, wherein $\lambda_1$ is 184.9 nm.

8. The manufacturing method according to claim 6, wherein $\lambda_2$ is 253.7 nm.

9. The manufacturing method according to claim 1, wherein the second substrate comprises at least one element selected from the group consisting of silicon, germanium, an alloy of silicon/germanium, sapphire, alumina, glass, quartz, and SiC.

10. The manufacturing method according to claim 1, wherein
   the second substrate comprises a second front face made of a III-V type semiconductor,
   the method further comprises: forming a second radical oxide layer by the radical oxidation on the second front face, and
   the second radical oxide layer contacts the first radical oxide layer after the direct bonding.

11. The manufacturing method according to claim 10, further comprising:
   de-oxidizing the second front face before forming the second radical oxide layer.

12. The manufacturing method according to claim 10, wherein the second substrate comprises at least one element selected from the group consisting of InP, GaAs, $In_{1-x}As_xP$, $InP_{1-y}Ga_y$, $In_{1-x}As_xP_{1-y}Ga_y$, and an alloy of Group III and Group V materials.

13. The manufacturing method according to claim 10, wherein the second radical oxide layer has a thickness of less than 5 nm.

14. The manufacturing method according to claim 10, wherein the second radical oxide layer has a thickness of less than 3 nm.

15. The manufacturing method according claim 1, wherein the first substrate comprises at least one element selected from the group consisting of InP, GaAs, $In_{1-x}As_xP$, $InP_{1-y}Ga_y$, $In_{1-x}As_xP_{1-y}Ga_y$, and an alloy of Group III and Group V materials.

16. The manufacturing method according to claim 1, wherein the first radical oxide layer has a thickness of less than 3 nm.

17. The manufacturing method according to claim 1, wherein the heat treatment is executed at a temperature of from 200° C. to less than 600° C.

18. The manufacturing method according to claim 1, wherein the radiation oxidation is executed at a temperature of less than 400° C.

19. The manufacturing method according to claim 1, wherein the first front face contains hydrocarbons, which are transformed into volatile species by the radical oxidation during said forming.

* * * * *